US008513716B2

(12) United States Patent
Ueda et al.

(10) Patent No.: US 8,513,716 B2
(45) Date of Patent: Aug. 20, 2013

(54) SEMICONDUCTOR DEVICE

(75) Inventors: Yoshitaka Ueda, Ogaki (JP); Kouichi Yamada, Gifu (JP); Atsushi Wada, Ogaki (JP); Shigeto Kobayashi, Gifu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 285 days.

(21) Appl. No.: 13/016,481

(22) Filed: Jan. 28, 2011

(65) Prior Publication Data
US 2011/0186935 A1 Aug. 4, 2011

(30) Foreign Application Priority Data

Jan. 29, 2010 (JP) ................................. 2010-019581

(51) Int. Cl.
*H01L 29/78* (2006.01)
(52) U.S. Cl.
USPC .... 257/288; 257/368; 257/390; 257/E29.122; 257/E29.136; 257/E27.081
(58) Field of Classification Search
USPC .................. 257/288, 368, E29.122, E29.136, 257/390, E27.081
See application file for complete search history.

(56) References Cited

U.S. PATENT DOCUMENTS

| 4,651,190 A | * | 3/1987 | Suzuki et al. | 257/206 |
| 5,436,485 A | * | 7/1995 | Shikatani et al. | 257/368 |
| 5,550,728 A | * | 8/1996 | Ellis | 363/60 |
| 5,635,736 A | * | 6/1997 | Funaki et al. | 257/202 |
| 5,714,784 A | * | 2/1998 | Ker et al. | 257/360 |
| 5,852,315 A | * | 12/1998 | Ker et al. | 257/355 |
| 6,137,143 A | * | 10/2000 | Dabral et al. | 257/355 |
| 7,012,304 B1 | * | 3/2006 | Dabral et al. | 257/355 |
| 7,078,775 B2 | | 7/2006 | Yi et al. | |

(Continued)

FOREIGN PATENT DOCUMENTS

| CN | 1571164 A | | 1/2005 |
| JP | 406112482 A | * | 4/1994 |

OTHER PUBLICATIONS

Yoo et al., "High Performance Low-Voltage Power MOSFETs with Hybrid Waffle Layout Stucture in a 0.25 um Standard CMOS Process", May 2008, Proceedings of the 20th International Symposium on Power Semiconductor Devices & IC's, pp. 95-98.*

(Continued)

*Primary Examiner* — Evan Pert
(74) *Attorney, Agent, or Firm* — McDermott Will & Emery LLP

(57) ABSTRACT

A MOS transistor includes a gate electrode formed in a grid pattern, source regions and drain regions each surrounded by the gate electrode, and a source metal wiring connected to the source regions via source contacts and a drain metal wiring connected to the drain regions via drain contacts. The source metal wiring and the drain metal wiring are disposed along one direction of the grid of the gate electrode. Each of the source regions and the drain regions is a rectangular form having its long side along the length direction of each metal wiring. The source metal wiring and the drain metal wiring are each formed in a zigzag manner in the length direction and are respectively connected to the source contacts and the drain contacts.

5 Claims, 13 Drawing Sheets

(56) References Cited

U.S. PATENT DOCUMENTS

| | | | | |
|---|---|---|---|---|
| 7,294,892 | B2 * | 11/2007 | Chen | 257/401 |
| 7,309,906 | B1 * | 12/2007 | Tyhach et al. | 257/532 |
| 7,763,939 | B2 * | 7/2010 | Leibiger | 257/341 |
| 8,080,847 | B2 * | 12/2011 | Leibiger | 257/341 |
| 8,324,707 | B2 * | 12/2012 | Sasaki et al. | 257/504 |
| 2004/0021181 | A1 * | 2/2004 | Christensen | 257/390 |
| 2005/0006710 | A1 | 1/2005 | Riedel | |

OTHER PUBLICATIONS

Wu et al., "High Frequency Characteristics of MOSFETs with Compact Waffle Layout", IEEE, Apr. 2004, pp. 381-384.*
Zhang et al., "High-speed Mixed Signal and RF Circuits Design With Compact Waffle MOSFET", IEEE, Feb. 2002, pp. 103-106.*
Alan Hastings, "The Art of Analog Layout," Applications of MOS Transistor, Chapter 12, pp. 416-417.

* cited by examiner

WIRING LENGTH DIRECTION

WIRING LENGTH DIRECTION

20

SEMICONDUCTOR DEVICE

This application is based upon and claims the benefit of priority from the prior Japanese Patent Applications No. 2010-019581, filed on Jan. 29, 2010, the entire contents of which are incorporated herein by reference.

BACKGROUND OF THE INVENTION

1. Field of the Invention

The present invention relates to a semiconductor device and, in particular, to a semiconductor device having a transistor which has source regions and drain regions arranged adjoining each other with a grid-like gate electrode disposed therebetween.

2. Description of the Related Art

There is a conventionally known MOS transistor having a gate electrode formed in a grid pattern so as to raise the efficiency of the gate width (GW) per unit area. This MOS transistor is called a waffle transistor.

FIG. 1 shows a schematic plane composition of a conventional grid-like transistor 1. The grid-like transistor 1 has a gate electrode 2 formed in a grid pattern and diffusion regions surrounded by the gate electrode 2. The diffusion regions are each square-shaped, thereby raising the density of the circuit. The diffusion regions are each a source region 3 or a drain region 4, and the source region 3 and the drain region 4 are arranged alternately adjacent to each other with the gate electrode 2 disposed therebetween. Formed on the source region 3 and the drain region 4 are a source contact 5 and a drain contact 6, respectively, for connection to a metal wiring.

In the grid-like transistor 1, all the source regions 3 and all the drain regions 4 are connected to their common electrodes, respectively. In the grid-like transistor 1, the source contacts 5 are connected to a source metal wiring extending in a direction along the grid of the gate electrode 2, and the drain contacts 6 are connected to a drain metal wiring extending in the same direction along the grid of the gate electrode 2, in a first metal layer above a back-gate diffusion layer. In the first metal layer, the source metal wiring and the drain metal wiring are formed alternately with each other. In a second metal layer, which is above the first metal layer, a plurality of source metal wirings are connected to a common source electrode whereas a plurality of drain metal wirings are connected to a common drain electrode.

FIG. 2 shows an example of schematic arrangement of metal wirings in a first metal layer. As illustrated in FIG. 2, a source metal wiring 7 and a drain metal wiring 8 are formed in such a manner as to extend in the same direction along the grid of a gate electrode 2. And they are connected to source contacts 5 and drain contacts 6, respectively. Note, however, that the drain metal wirings 8 connecting to the drain contacts 6 on the upper and lower sides of the planar view are not shown in FIG. 2.

The source metal wiring 7 and the drain metal wiring 8 have each a form composed of a thin rectangular region, which is so formed as to cover top of the gate electrode 2 extending in a length direction, and projecting regions, which protrude in a width direction from the rectangular region to be connected to the contact in each diffusion region. As shown in FIG. 2, therefore, the width of the metal wiring is greater where there is the projecting region and smaller where there is not. Especially when the diffusion regions are formed at a highest density, there occur instances where diagonal wiring cannot be made due to layout limitations. Thus, variation of the width of the metal wiring in the length direction causes an increase in parasitic resistance in the narrow-width regions.

The parasitic resistance of the metal wiring adds to the input/output resistance of the MOS transistor. The increase in the parasitic resistance is not desirable because it will result in an increase in overall on-resistance, which is a combination of the on-resistance of the transistor and the parasitic resistance of the wiring, and a loss of drive capacity. The grid-like transistor has been introduced with the primary purpose of downsizing the circuit by raising the efficiency of the gate width (GW) per unit area, thereby reducing the on-resistance of the transistor and enhancing the drive capacity. However, this original advantage of the grid-like transistor can be lost if the overall on-resistance increases due to the increase in the metal wiring resistance.

SUMMARY OF THE INVENTION

The present invention has been made in view of these circumstances, and a purpose thereof is to provide a semiconductor device that features a reduced resistance of the metal wiring. Another purpose of the invention is to realize a downsizing of electronic circuitry.

In order to address the above-described problems, a semiconductor device according to one embodiment of the present invention has a transistor, and the transistor comprises: a gate electrode formed in a grid pattern; source regions and drain regions each surrounded by the gate electrode; and metal wirings disposed along one direction of a grid of the gate electrode and connected to the source regions and drain regions via contacts, the source regions and the drain regions being arranged adjoining each other with said gate electrode held therebetween, wherein each of the source regions and the drain regions is a rectangular form having a long side along a length direction of the metal wiring.

It is to be noted that any arbitrary combinations or rearrangement of the aforementioned structural components and so forth are all effective as and encompassed by the embodiments of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

The invention will now be described by reference to the preferred embodiments. This does not intend to limit the scope of the present invention, but to exemplify the invention.

Figure 3:
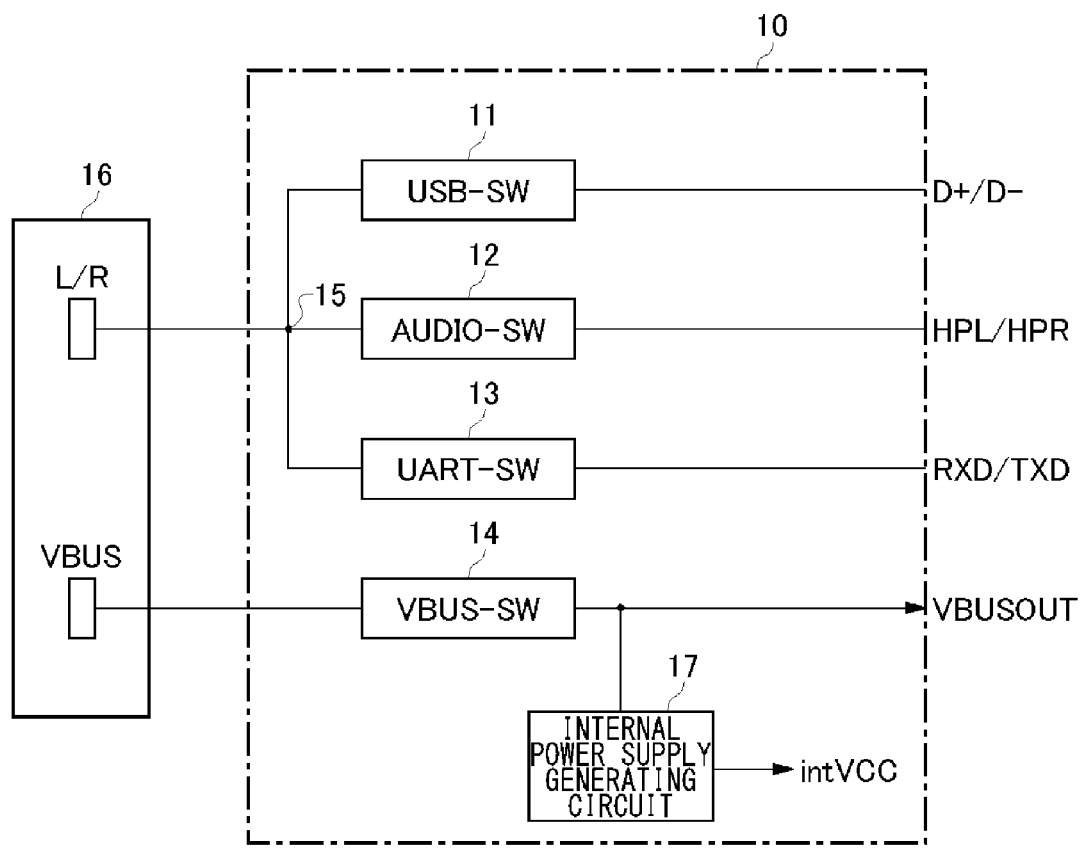
FIG. 3 shows a structure of a switch circuit according to an embodiment of the present invention.

FIG. 3 shows a structure of a switch circuit 10 according to an embodiment of the present invention. The switch circuit 10 is incorporated into an electronic device such as a mobile phone or a personal digital assistant (PDA). The electronic device has a connector 16 to which an external device, such as a personal computer (PC), and a peripheral device, such as a earphone, are connected. In the switch circuit 10, a common input/output 15 is connected to the connector 16, and signals inputted from and outputted to the external device or peripheral device pass through this common input/output 15. The switch circuit 10 is configured by including at least a USB-SW 11, an AUDIO-SW 12, a UART-SW 13 and a VBUS-SW 14.

When the electronic device is connected to the external device through the connector 16 by the use of a universal serial bus (USB), the USB-SW 11 is turned on and it is then possible to transmit and receive USB signals. At this time, the VBUS-SW 14 is also turned on and a VBUS power supply supplied through the USB is outputted as VBUSOUT and, at the same time, an internal power supply generating circuit 17 generates an internal power supply intVCC. When the earphone is connected to the connector 16, the AUDIO-SW 12 is turned on and audio is outputted from the earphone. When UART (universal asynchronous receiver transmitter) signals are transmitted or received, the UART-SW 13 is turned on. In this manner, the switch circuit 10 turns on/off each switch according to a device connected to the connector 16.

It is desirable that the overall on-resistance (on-resistance of the transistor+parasitic resistance of the wiring) of the switch circuit 10 be held as low as practicable in order to pass high-frequency signals or analog audio signals of low input levels at low loss and low distortion. On the other hand, if the bandwidth of the USB-SW is to be widened, it is desirable that a lower capacity for the common input/output 15 be realized. Generally, the gate width (GW) must be increased if the on-resistance of the transistor is to be reduced but it has a side effect of an increased parasitic capacity. The inventors have taken particular note of the fact that the grid-like transistor, with a raised efficiency of the gate width (GW) per unit area, can contribute not only to the downsizing of the circuit but also to the reduction of both the on-resistance and the parasitic capacity. Thus, the inventors have conceived a layout that reduces the metal wiring resistance which has been a problem with the conventional grid-like transistor.

Figure 4:
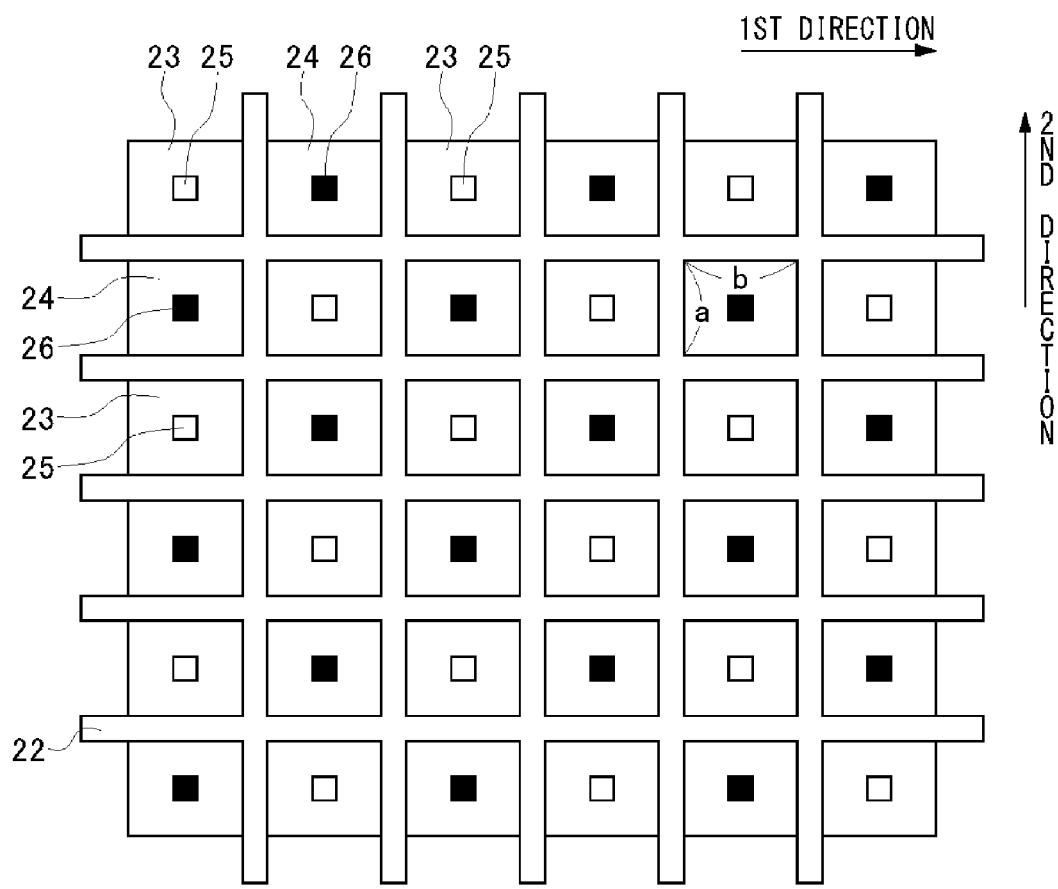
FIG. 4 shows a schematic plane composition of a semiconductor device according to an embodiment of the present invention.

FIG. 4 shows a schematic plane composition of a semiconductor device according to an embodiment of the present invention. The semiconductor device according to the present embodiment includes a MOS transistor 20, which is a grid-like transistor. The grid-like transistor offers an advantage of realizing the downsizing of the circuit as it can raise the efficiency of the gate width per unit area.

The MOS transistor 20 has a gate electrode 22 which is formed of polysilicon or the like in a grid pattern. More specifically, the gate electrode 22 is structured by a plurality of lines extending in a first direction with a predetermined first interval a in between and a plurality of lines extending in a second direction, perpendicular to the first direction, with a predetermined second interval b (>a) in between. A plurality of diffusion regions surrounded by the gate electrode 22, each having the same rectangular shape, are each a source region 23 or a drain region 24. The source region 23 and the drain region 24 are arranged alternately adjacent to each other with the gate electrode 22 disposed therebetween. In relation to a single source region 23, drain regions 24 are arranged on all four sides (above, below, right, left) adjacent to the source region 23 with the surrounding gate electrode 22 held therebetween. Similarly, in relation to a single drain region 24, source regions 23 are arranged on all four sides adjacent to the drain region 24 with the surrounding gate electrode 22 held therebetween. In other words, the source regions 23 and the drain regions 24 are arranged in a checkered pattern on a substrate, with the source regions 23 and the drain regions 24 continuing in diagonal directions, respectively. Formed on each of the source regions 23 and the drain regions 24 are a source contact 25 and a drain contact 26, respectively, for connection to a metal wiring of a first metal layer.

Figure 5:
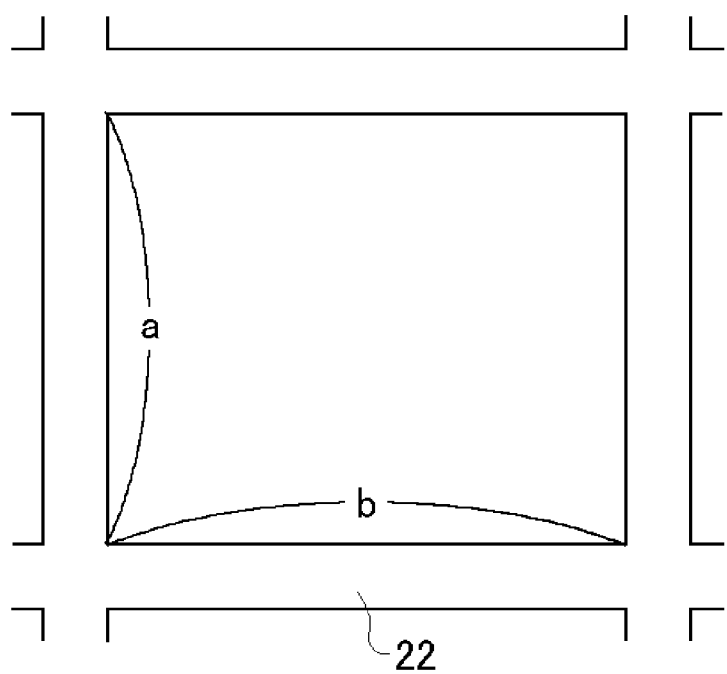
FIG. 5 shows a plane composition of a diffusion region which constitutes a source region or a drain region.

FIG. 5 shows a plane composition of a diffusion region which constitutes a source region 23 or a drain region 24. The diffusion region is formed in a rectangular shape in a MOS transistor according to the present embodiment. It is preferable that the aspect ratio (b/a) is 1.2 or more, where b is the length of the long side and a is the length of the short side. Preferably, the short side length a is set substantially equal to the length of a side of the diffusion region that can be realized when the density of the MOS transistor 20 is raised to the highest level. The source region 23 and the drain region 24 are each so formed that they have the long side along the length direction of the metal wiring of the first metal layer.

Figure 6:
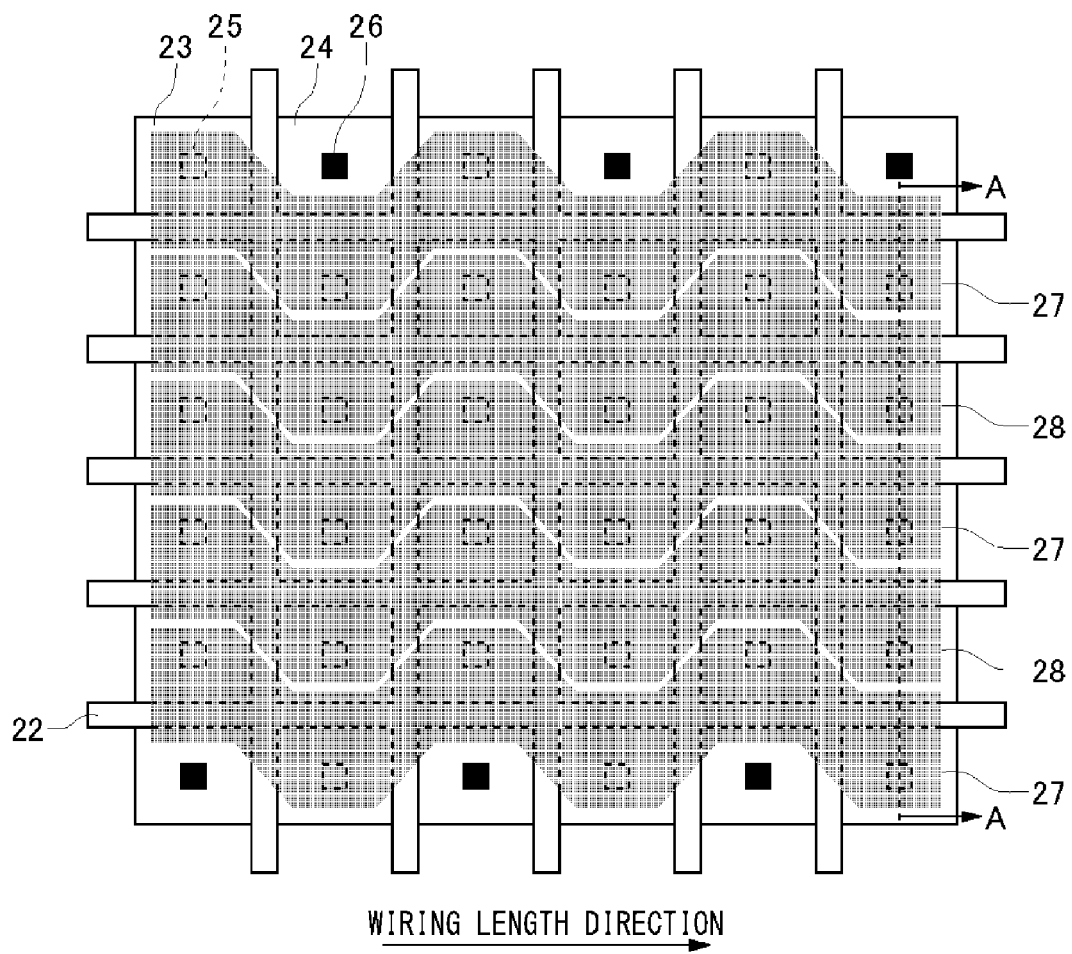
FIG. 6 shows an example of schematic arrangement of metal wirings in a first metal layer of a MOS transistor.
Figure 7:
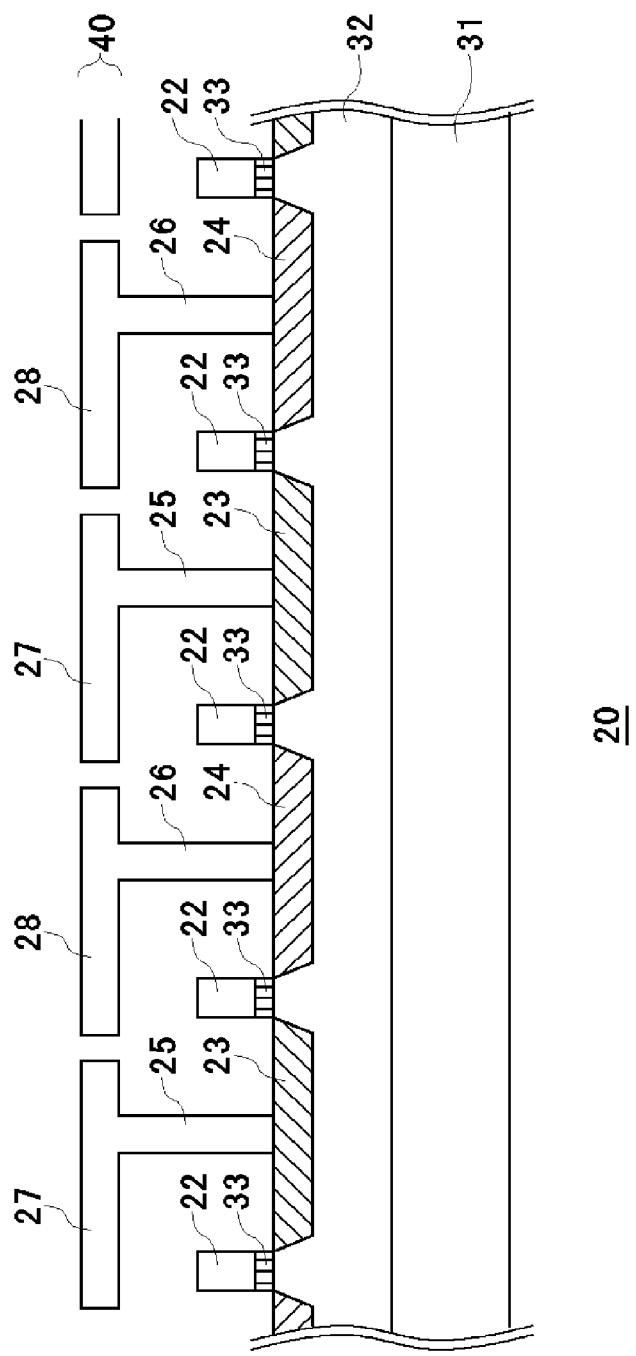
FIG. 7 shows a partial section of the MOS transistor of FIG. 6 taken along the line A-A.

FIG. 6 shows an example of schematic arrangement of metal wirings in a first metal layer of the MOS transistor 20. FIG. 7 shows a partial section of the MOS transistor 20 of FIG. 6 taken along the line A-A. Firstly, a description will be given of the MOS transistor 20 by referring to FIG. 7.

A back-gate diffusion layer 32 is formed on a surface of a P-type silicon substrate 31. A source region 23 and a drain region 24 are formed alternately in a repetitive manner in the surface layer of the back-gate diffusion layer 32. A gate electrode 22 is formed via a gate oxide film 33 on a channel region between the source region 23 and the drain region 24. In a first metal layer 40, a source metal wiring 27 and a drain metal wiring 28 are formed, and the source region 23 and the drain region 24 are connected to the source metal wiring 27 and the drain metal wiring 28 via a source contact 25 and a drain contact 26, respectively. Note that an interlayer insulation film and the like between the gate electrode 22 and the first metal layer 40 are not shown in the illustration.

Referring to FIG. 6, the source metal wiring 27 and the drain metal wiring 28 are arranged along one direction of the grid of the gate electrode 22 and connected to a plurality of the source contacts 25 and a plurality of the drain contacts 26, respectively. With the source metal wiring 27 and the drain metal wiring 28 arranged along one direction of the grid of the gate electrode 22, the plurality of metal wirings have substantially the same length within the MOS transistor 20, so that, compared with the case of the plurality of metal wirings having different lengths, the distribution of parasitic resistance of metal wirings can be made even within the MOS transistor 20. It is to be understood that while, in the planar view of the illustration, the drain metal wirings 28 are not connected to the drain contacts 26 positioned on the upper and lower sides thereof, the drain metal wirings 28 are actually connected thereto.

The source metal wiring 27 and the drain metal wiring 28 are each formed in a zigzag manner in the length direction and are respectively connected to the source contacts 25 and the drain contacts 26. The source metal wiring 27 is disposed above a gate line extending in the length direction and connected to the source contacts 25 formed on the source regions 23 positioned on both sides of the gate line. Thus, the source metal wiring 27, which is formed in a zigzag manner, can be efficiently connected to the source contacts 25 disposed in a zigzag manner on both sides of a gate line.

Similarly, the drain metal wiring 28 is disposed above a gate line extending in the length direction and connected to the drain contacts 26 formed on the drain regions 24 positioned on both sides of the gate line. Thus, the drain metal wiring 28, which is formed in a zigzag manner, can be efficiently connected to the drain contacts 26 disposed in a zigzag manner on both sides of a gate line.

Specifically, in the first metal layer 40, the source metal wiring 27 is disposed in superposition on the gate line extending in the length direction thereof. Disposition of the source metal wiring 27 in superposition to cover the gate electrode 22 extending in one direction increases the coverage of the source metal wiring 27, thus making the parasitic resistance smaller. A plurality of source metal wirings 27 are connected to a common source electrode in a second metal layer, which is formed above the first metal layer 40 via an interlayer insulation film. Also, in the first metal layer 40, the drain metal wiring 28 is disposed in superposition on the gate line extending in the length direction thereof. Disposition of the drain metal wiring 28 in superposition to cover the gate electrode 22 extending in one direction increases the coverage of the drain metal wiring 28, thus making the parasitic resistance smaller. A plurality of drain metal wirings 28 are connected to a common drain electrode in the second metal layer, which is formed above the first metal layer 40 via an interlayer insulation film.

Figure 1:
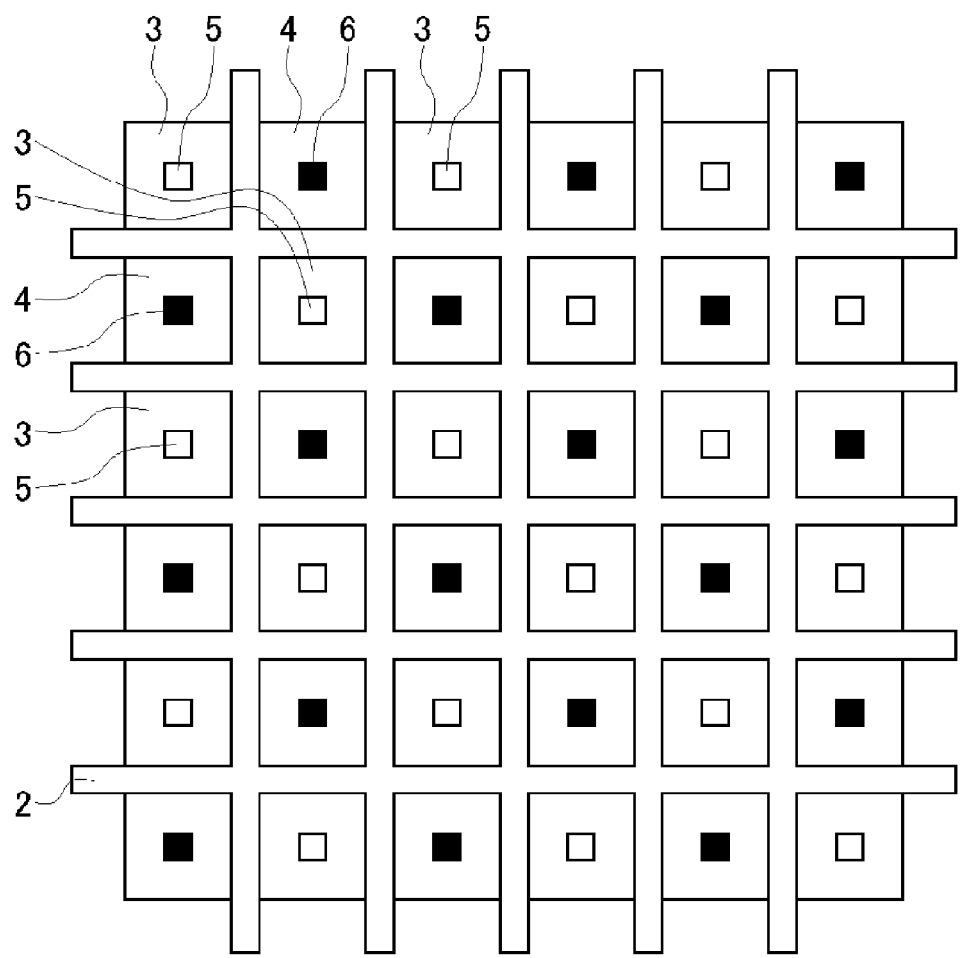
FIG. 1 shows a schematic plane composition of a conventional grid-like transistor.
Figure 2:
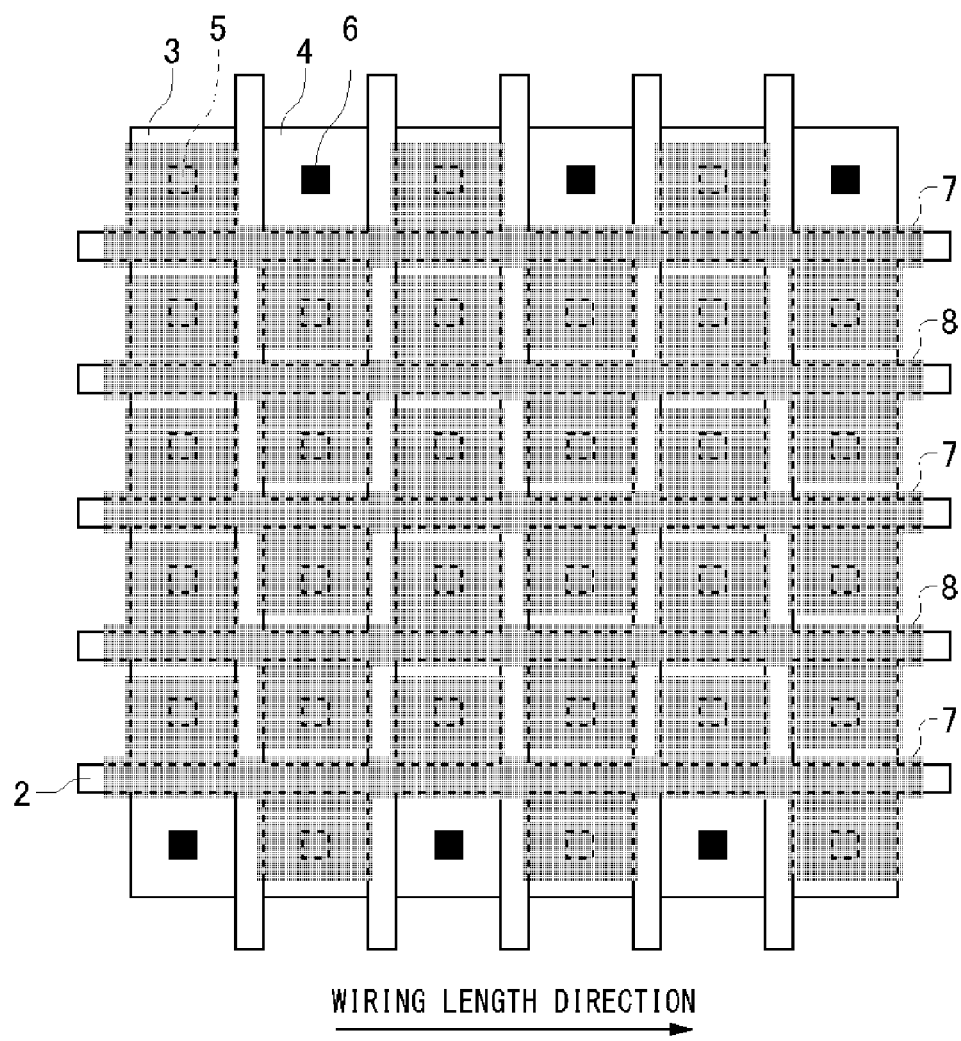
FIG. 2 shows an example of schematic arrangement of metal wirings in a first metal layer.

The source metal wiring 27 has the same width in the length direction thereof (length in the direction perpendicular to the length direction). Compared with the source metal wiring 7 shown in FIG. 2, the source metal wiring 27 formed with a uniform width has a smaller parasitic resistance. Similarly, the drain metal wiring 28 has the same width in the length direction thereof. Compared with the drain metal wiring 8 shown in FIG. 2, the drain metal wiring 28 formed with a uniform width has a smaller parasitic resistance. The source metal wiring 27 and the drain metal wiring 28 may be so formed as to have the same shape and the same width.

Also, it is preferable that the source metal wiring 27 and the drain metal wiring 28 are arranged with a predetermined clearance between each other along the length direction. Preferably, the source metal wiring 27 and the drain metal wiring 28 are formed with a width as wide as practicable while retaining the predetermined clearance in the length direction. Such a design can further reduce the parasitic resistance of the wirings.

Shown in FIG. 6 is a structure of a MOS transistor 20 having a total of 36 diffusion regions. The source regions 23 and the drain regions 24 of the MOS transistor 20 are short-circuited respectively in the second metal layer. It should be appreciated that a single transistor can also be formed by combining a plurality of the MOS transistors 20, which are grid-like transistors, into a unit. A MOS transistor 20 of a certain size may be fabricated into a transistor unit module. Then two-dimensionally combining a plurality of transistor units can make the wiring and the like shorter, thus realizing a lower-capacity transistor.

As already mentioned, in a single transistor unit (e.g., a MOS transistor 20), a plurality of source regions 23 and a plurality of drain regions 24 are respectively connected together by a common source electrode and a common drain electrode formed in the second metal layer. When a single transistor is to be formed by a plurality of transistor units, the source electrodes and the drain electrodes of the respective transistor units may be connected in the second metal layer or the source electrodes and the drain electrodes of the respective transistor units in the second metal layer may be connected in a third metal layer which is formed above the second metal layer. Using a configuration as described above, it is possible to form a single MOS transistor from a plurality of transistor units.

Figure 8:
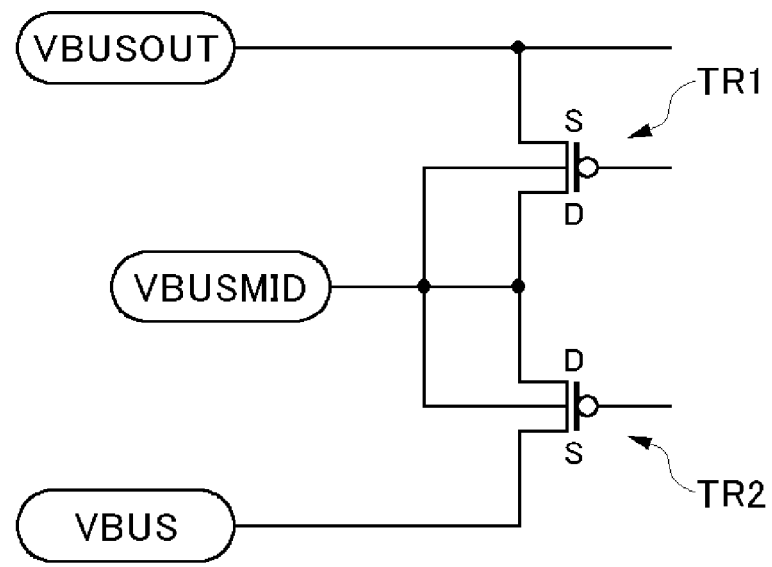
FIG. 8 is circuit diagram of VBUS-SW.

FIG. 8 is circuit diagram of the VBUS-SW 14. The VBUS-SW 14 is configured by a transistor TR1 and a transistor TR2, and the respective drains of both the transistor TR1 and the transistor TR2 are connected to each other. The transistor TR1 and the transistor TR2 are each constituted by a plurality of transistor units.

Figure 9:
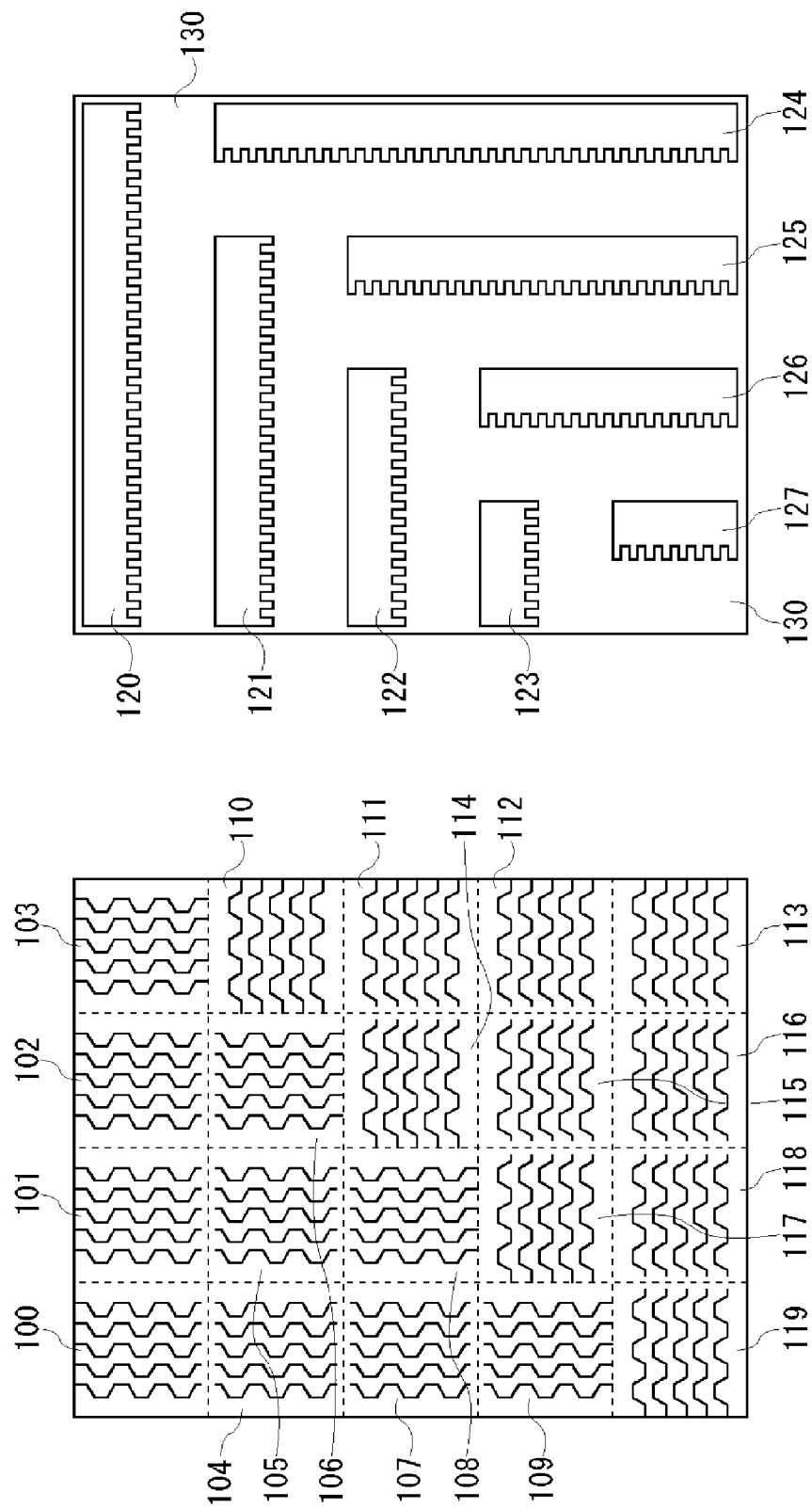
FIG. 9A shows a schematic plane composition of a first metal layer when twenty transistor units are arranged.
FIG. 9B shows a schematic plane composition of a second metal layer.

FIG. 9A shows a schematic plane composition of a first metal layer when twenty transistor units 100 to 119 are arranged. In this example, the transistor TR1 is configured by ten transistor units 100, 101, 102, 103, 104, 105, 106, 107, 108 and 109. The transistor TR2 is configured by ten transistor units 110, 111, 112, 113, 114, 115, 116, 117, 118 and 119. As shown in FIG. 9A, a wiring length direction of the transistor units constituting the transistor TR1 is perpendicular to the a wiring length direction of the transistor units constituting TR2.

FIG. 9B shows a schematic plane composition of a second metal layer. In the second metal layer, the drain metal wirings of the transistor units 100 to 119 are connected in common to a drain electrode 130.

The source metal wirings of the transistor units 100 to 109 constituting the transistor TR1 are connected to source electrodes 120, 121, 122 and 123. More specifically, the source metal wirings of the transistor units 100 to 103 are connected to the source electrode 120, whereas the source metal wirings of the transistor units 104 to 106 are connected to the source electrode 121. Also, the source metal wirings of the transistor units 107 and 108 are connected to the source electrode 122 whereas the source metal wiring of the transistor unit 109 is connected to the source electrode 123.

The source metal wirings of the transistor units 110 to 119 constituting the transistor TR2 are connected to source electrodes 124, 125, 126 and 127. More specifically, the source metal wirings of the transistor units 110 to 113 are connected to the source electrode 124, whereas the source metal wirings of the transistor units 114 to 116 are connected to the source electrode 125. Also, the source metal wirings of the transistor units 117 and 118 are connected to the source electrode 126 whereas the source metal wiring of the transistor unit 119 is connected to the source electrode 127.

Figure 10:
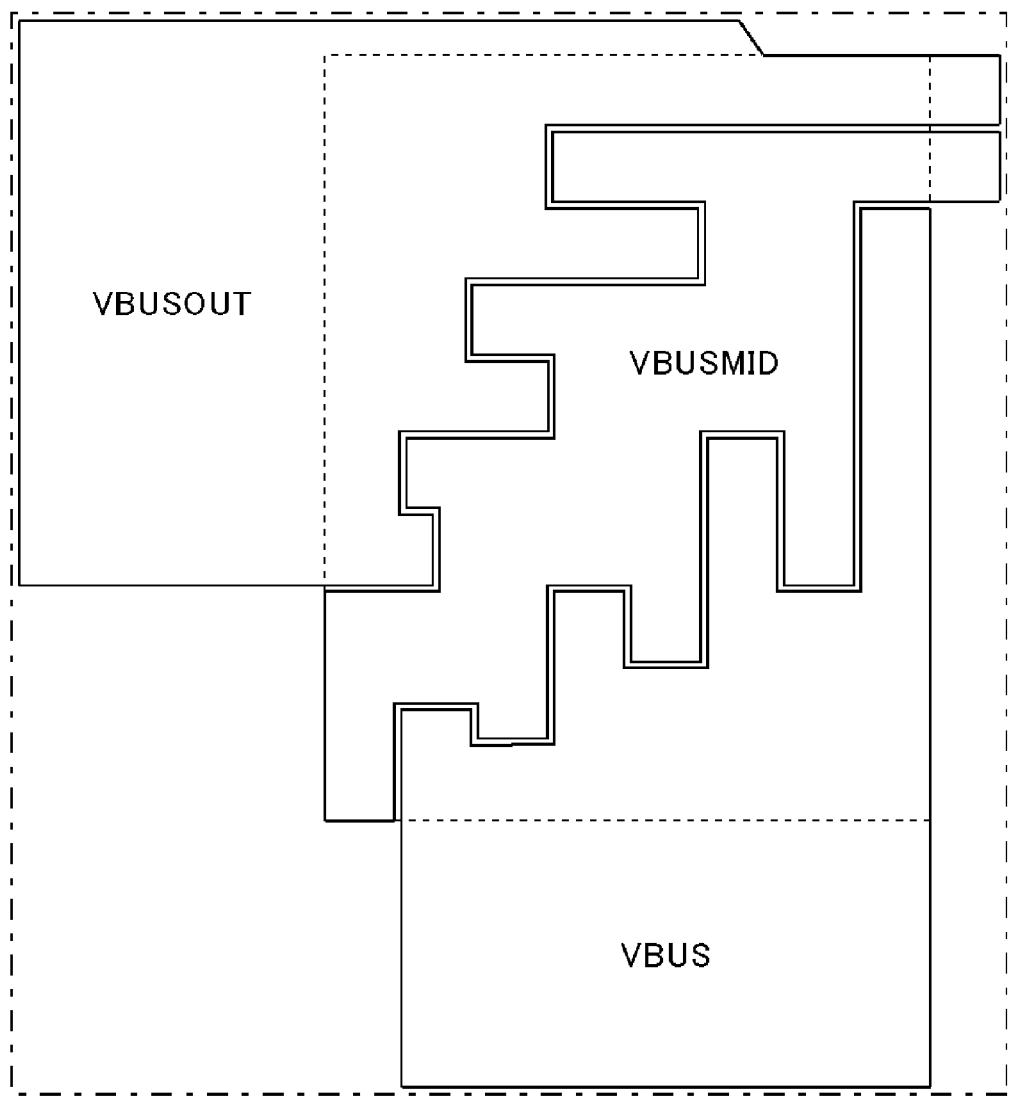
FIG. 10 shows a schematic plane composition of a third metal layer.

FIG. 10 shows a schematic plane composition of the third metal layer. A region demarcated by a dashed-dotted line represents a chip form of the VBUS-SW 14. The source electrodes 120 to 123 are connected to VBUSOUT, whereas the source electrodes 124 to 127 are connected to VBUS. The drain electrode 130 is connected to VBUSMID. The VBUS, which is an input to the VBUS-SW 14, and the VBUSOUT, which is an output thereof, are arranged in corners of the chip, so that the wiring resistance in input and output can be lowered.

As described above, the VBUS-SW 14 is configured such that a plurality of transistor units 100 to 119 are connected together by combining them two-dimensionally. More specifically, the transistor TR1 is configured by connecting the ten transistor units 100 to 109 in a staircase pattern, and the transistor TR2 is configured by connecting the ten transistor units 110 to 119 in a staircase pattern. Then the staircase parts thereof are joined together, thereby constructing a transistor switch.

Also, the VBUS-SW 14 may be configured by arranging the transistor units 100 to 119 in series one-dimensionally, for instance. In this case, the electrode length in the second metal layer will be longer. Accordingly, the parasitic capacity in the case where the transistors 100 to 119 are connected in one-dimensionally will increase as compared with the case where the transistor units 100 to 119 are combined two-dimensionally. Thus, as described above, it is possible to configure VBUS-SW 14 whose parasitic resistance is reduced if the transistor units 100 to 119 are arranged two dimensionally.

A description is now given of a structure in which the capacity of the common input/output 15 in the switch circuit 10 is further reduced.

In order to pass a high-frequency USB signal, the parasitic capacity in the common input/output 15 is desirably as low as possible. However, since a plurality of switches are connected to the common input/output 15, the capacity in each switch poses a hindrance to the lower capacity of the common input/output 15. In particular, the parasitic capacity of the AUDIO-SW 12 is large, so that the reduction of the parasitic capacity of the AUDIO-SW 12 can contribute to a marked reduction of the parasitic capacity in the common input/output 15.

Figure 11:
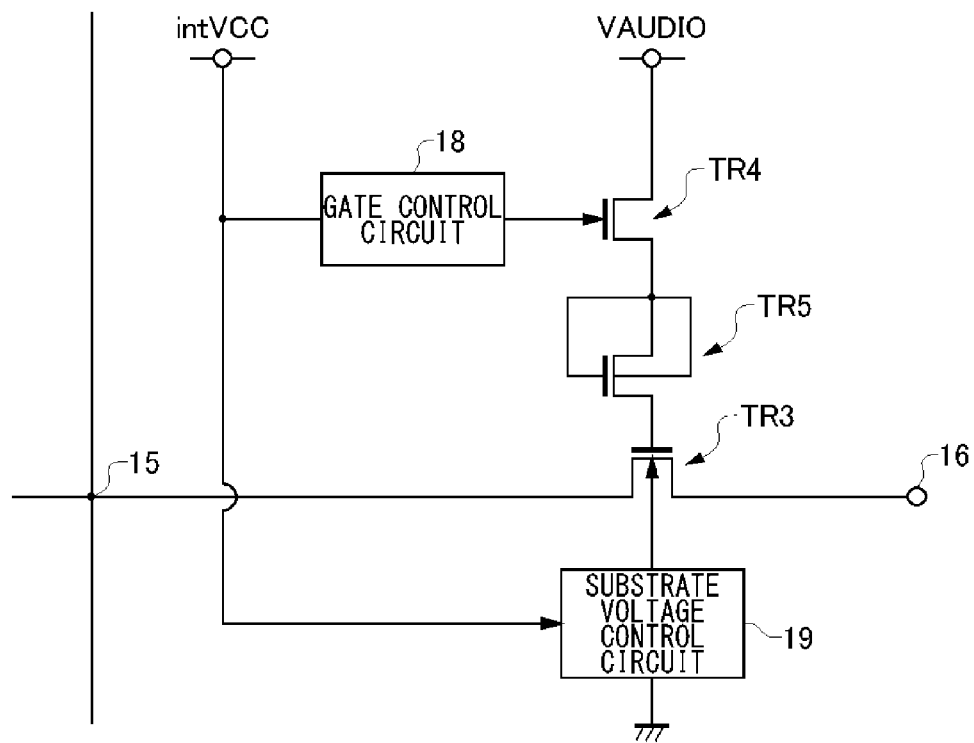
FIG. 11 is circuit diagram of AUDIO-SW.

FIG. 11 is circuit diagram of the AUDIO-SW 12. The AUDIO-SW 12 includes a transistor TR3 which is turned on when audio is outputted to the common input/output 15 from a terminal 16.

The conventional AUDIO-SW is configured such that all circuit elements can be operated at the maximum power supply voltage intVCC. In particular, the circuit elements capable of withstanding the supply of the maximum internal power supply voltage intVCC must be used in the electronic device where VBUS is supplied as the internal power supply voltage intVCC when the external device is USB-connected, and the battery voltage is supplied as the internal power supply voltage intVCC when the external device is not USB-connected. Suppose that the VBUS (5 V) is the maximum internal power supply voltage intVCC, then the circuit elements capable of withstanding the supply of 5 V is used. For the above-described reason, a transistor capable of withstanding 5V is used for the transistor TR3 in the conventional AUDIO-SW and therefore there is problem of an increased parasitic capacity in the common input/output 15.

Thus, in the AUDIO-SW 12 according to the present embodiment, a transistor capable of withstanding a voltage lower than the maximum internal power supply voltage intVCC (5 V) is used as the transistor TR3. For example, a transistor capable of withstanding the supply of 3 V is used as the transistor TR3. On the other hand, a transistor capable of withstanding the supply of 5 V is used for the circuit elements for supplying the voltage to the transistor TR3. More specifically, the transistor capable of withstanding the supply of 5 V is used for each one of the transistors TR4 and TR5, transistors constituting a gate control circuit 18 and those constituting a substrate voltage control circuit 19. Provision of the transistor TR5 allows the gate voltage of the transistor TR3 to be reduced to 3 V or lower. In this manner, a circuit element for dropping the gate voltage of the transistor TR3 is formed, so that the transistor TR3 can be configured by a transistor, whose gate oxide film is thin, which is capable of withstanding a low voltage and therefore the capacity of the common input/output 15 can be reduced.

The present invention has been described based on the exemplary embodiments. The exemplary embodiments are intended to be illustrative only, and it is understood by those skilled in the art that various modifications to constituting elements and processes as well as arbitrary combinations thereof could be further developed and that such modifications and combinations are also within the scope of the present invention.

Figure 12:
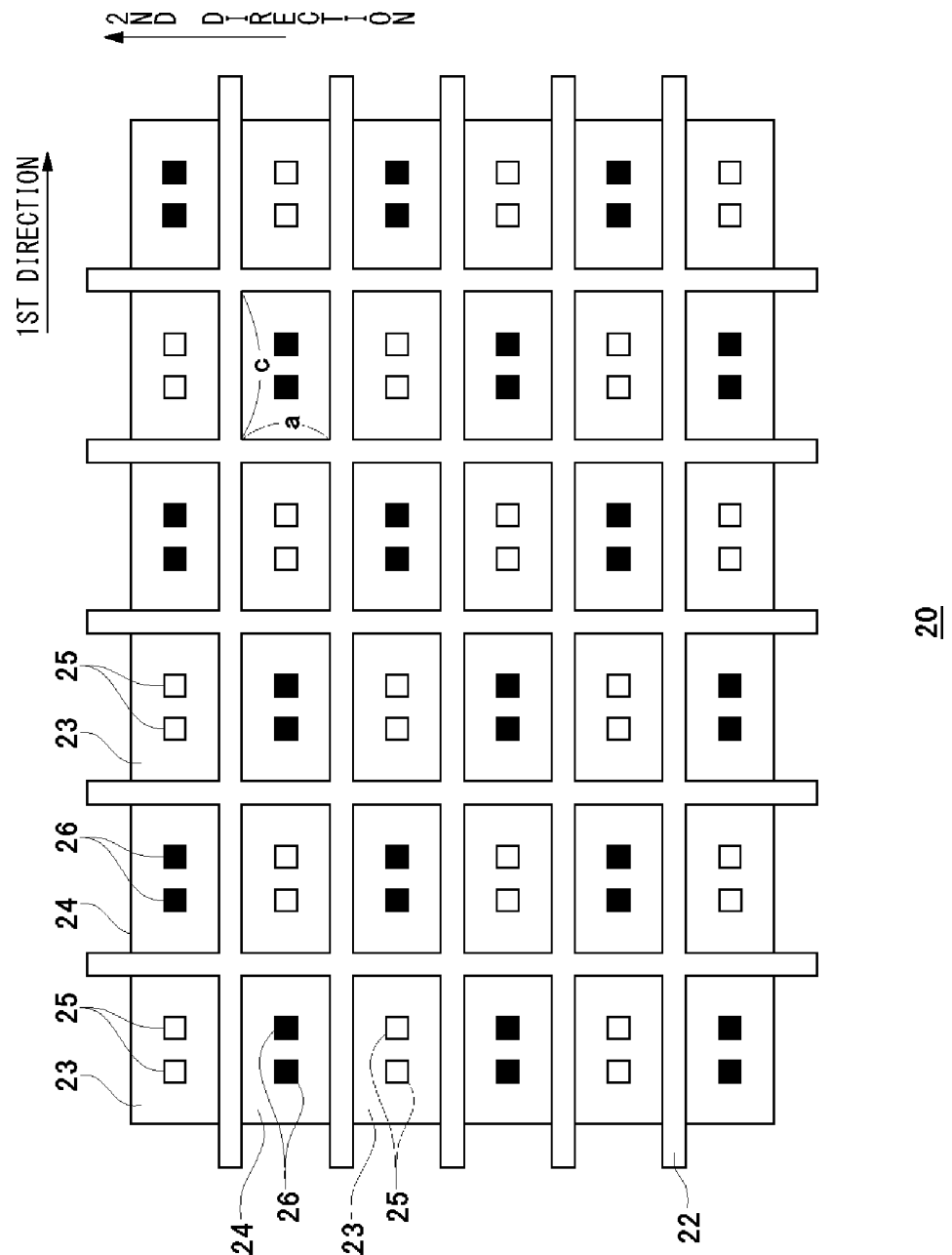
FIG. 12 shows a modification to a schematic plane composition of a semiconductor device according to an embodiment.

FIG. 12 shows a modification to a schematic plane composition of a semiconductor device according to an embodiment. Compared with FIG. 4, the MOS transistor 20 of FIG. 12 is structured such that each source region 23 has a plurality of source contacts 25 and each drain region 24 has a plurality of drain contacts 26. A gate electrode 22 is structured by a plurality of lines extending in a first direction with a predetermined first interval a in between and a plurality of lines extending in a second direction, perpendicular to the first direction, with a predetermined second interval c (>a) in between.

Formation of a plurality of source contacts 25 in each source region 23 and formation of a plurality of drain contacts 26 in each drain region 24 result in the reduction of their respective contact resistances. In the example of FIG. 12, two contacts are formed in each diffusion region; however, this is not considered as limiting and, for example, three contacts or four or more contacts may be formed in each diffusion region.

Figure 13:
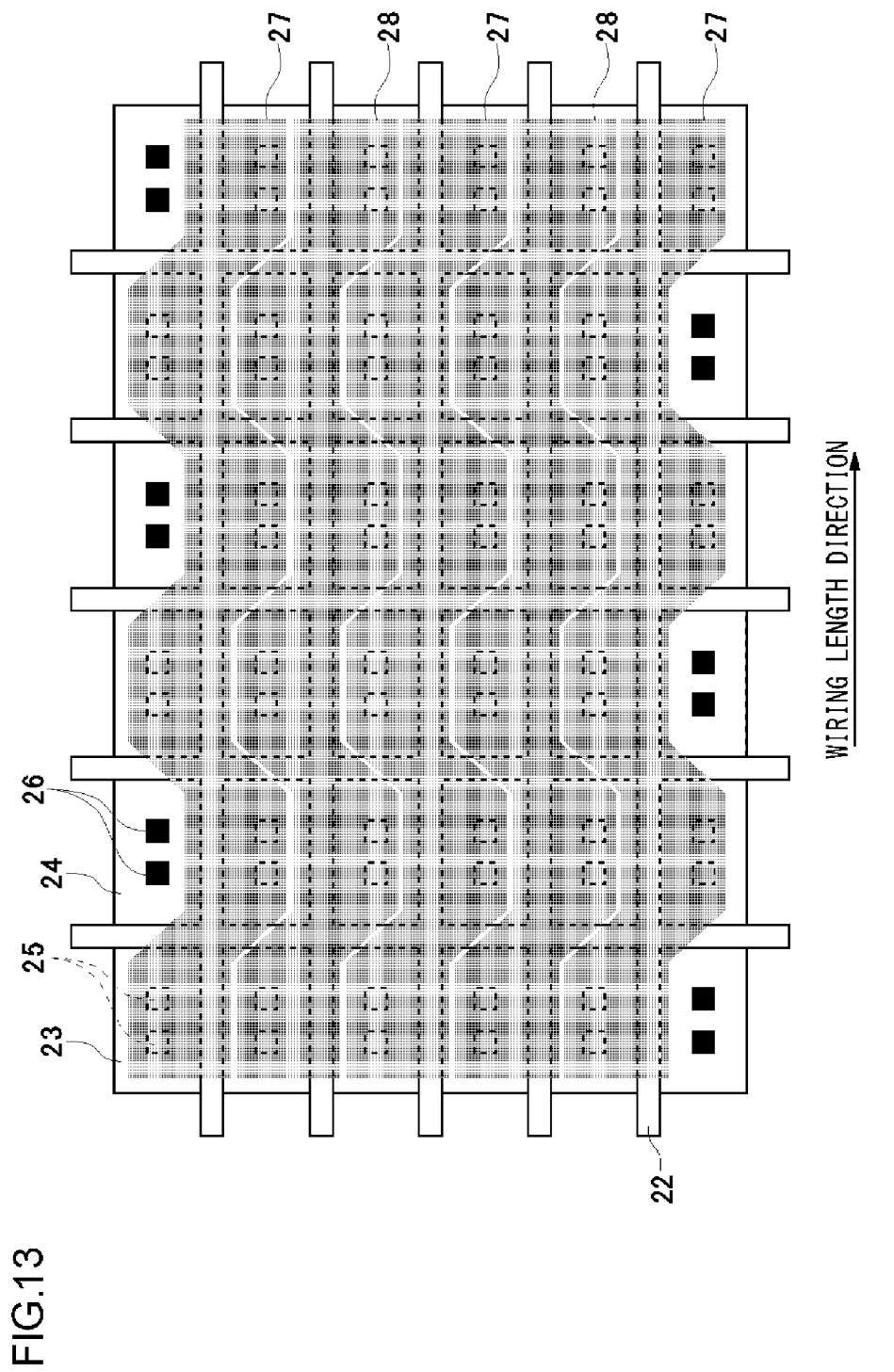
FIG. 13 shows a modification to a schematic arrangement of metal wirings in a first metal layer of a MOS transistor.

FIG. 13 shows a modification to the schematic arrangement of metal wirings in the first metal layer of the MOS transistor 20 shown in FIG. 12. Source metal wiring 27 and drain metal wiring 28 are arranged along one direction of the grid of the gate electrode 22 and connected to a plurality of the source contacts 25 and a plurality of the drain contacts 26, respectively. In the MOS transistor 20 shown in FIG. 12, a plurality of contacts are formed in each diffusion region, and these contacts are preferably arranged within the diffusion region along a direction that the metal wiring extends. With the contacts arranged within the diffusion region along the direction that the metal wiring extends, the metal wiring can be efficiently connected to the contacts without increasing the parasitic capacity.

What is claimed is:

1. A semiconductor device having a waffle transistor, the waffle transistor comprising:
    a gate electrode formed in a grid pattern;
    source regions and drain regions each surrounded by said gate electrode, forming said waffle transistor; and
    metal wirings disposed along one direction of the grid pattern of said gate electrode and connected to the source regions and drain regions via contacts,
    wherein the source regions and the drain regions are arranged adjoining each other with said gate electrode held therebetween, and
    wherein each of the source regions and the drain regions is a rectangular form having a long side along a length direction of said metal wiring.

2. A semiconductor device according to claim 1, wherein said metal wirings include a source metal wiring connected to source contacts formed in the source regions and a drain metal wiring connected to drain contacts formed in the drain regions, and wherein the source metal wiring and the drain metal wiring are each formed in a zigzag manner in a length direction and are respectively connected to the source contacts and the drain contacts.

3. A semiconductor device according to claim 2, wherein the source metal wiring and the drain metal wiring are each disposed in superposition on the gate electrode extending in a length direction thereof.

4. A semiconductor device according to claim 2, wherein the source metal wiring has an identical width in a length direction thereof, and the drain metal wiring has an identical width in a length direction thereof.

5. A semiconductor device according to claim 3, wherein the source metal wiring has an identical width in a length direction thereof, and the drain metal wiring has an identical width in a length direction thereof.

* * * * *